(12) United States Patent
Miller et al.

(10) Patent No.: US 11,934,654 B2
(45) Date of Patent: Mar. 19, 2024

(54) MEMORY DEVICE HAVING HIDDEN REFRESH

(71) Applicant: Rambus Inc., San Jose, CA (US)

(72) Inventors: Michael Raymond Miller, Raleigh, NC (US); Steven C. Woo, Saratoga, CA (US); Thomas Vogelsang, Mountain View, CA (US)

(73) Assignee: Rambus Inc., San Jose, CA (US)

( * ) Notice: Subject to any disclaimer, the term of this patent is extended or adjusted under 35 U.S.C. 154(b) by 114 days.

(21) Appl. No.: 17/544,584

(22) Filed: Dec. 7, 2021

(65) Prior Publication Data

US 2022/0179556 A1 Jun. 9, 2022

Related U.S. Application Data

(60) Provisional application No. 63/122,667, filed on Dec. 8, 2020.

(51) Int. Cl.
*G06F 3/06* (2006.01)
*G11C 11/406* (2006.01)

(52) U.S. Cl.
CPC .......... *G06F 3/0604* (2013.01); *G06F 3/0659* (2013.01); *G06F 3/0673* (2013.01); *G11C 11/40611* (2013.01); *G11C 11/40615* (2013.01)

(58) Field of Classification Search
CPC .... G06F 3/0604; G06F 3/0659; G06F 3/0673; G06F 13/1636; G11C 11/406; G11C 11/40603; G11C 11/40615; G11C 11/40618; G11C 11/40611
See application file for complete search history.

(56) References Cited

U.S. PATENT DOCUMENTS

| | | | |
|---|---|---|---|
| 6,941,415 B1 | 9/2005 | Ryan | |
| 7,313,047 B2* | 12/2007 | Kim | G11C 11/40603 365/222 |
| 9,928,895 B2* | 3/2018 | Loh | G11C 11/4096 |
| 10,354,714 B2* | 7/2019 | Morgan | G11C 11/40626 |

* cited by examiner

*Primary Examiner* — Idriss N Alrobaye
*Assistant Examiner* — Richard B Franklin
(74) *Attorney, Agent, or Firm* — Lance Kreisman; Peninsula Patent Group

(57) ABSTRACT

An integrated circuit (IC) memory device includes an array of storage cells configured into multiple banks. Interface circuitry receives refresh commands from a host memory controller to refresh the multiple banks for a first refresh mode. On-die refresh control circuitry selectively generates local refresh commands to refresh the multiple banks in cooperation with the host memory controller during a designated hidden refresh interval in a second refresh mode. Mode register circuitry stores a value indicating whether the on-die refresh control circuitry is enabled for use during the second refresh mode. The interface circuitry includes back-channel control circuitry to transmit a corrective action control signal during operation in the second refresh mode.

18 Claims, 4 Drawing Sheets

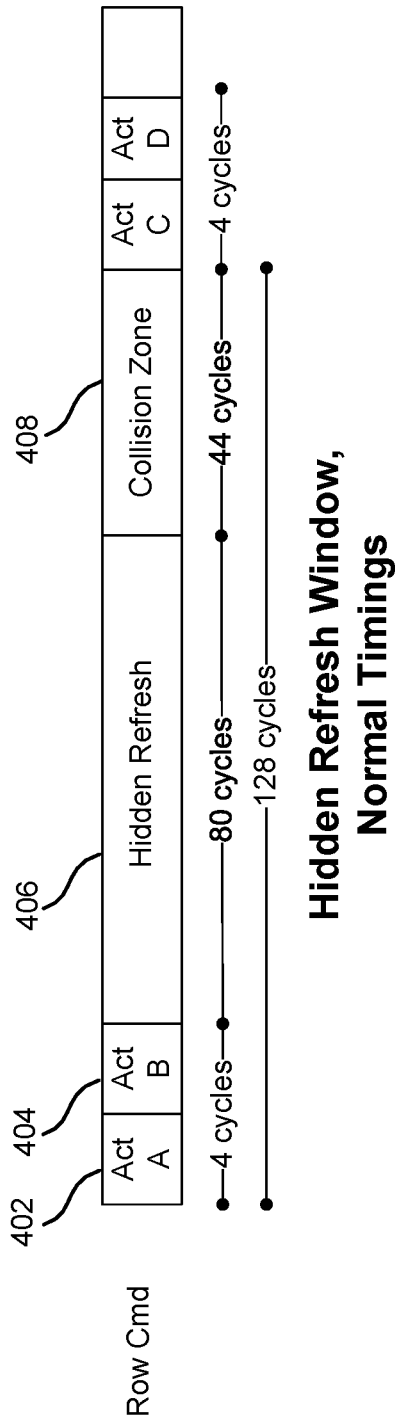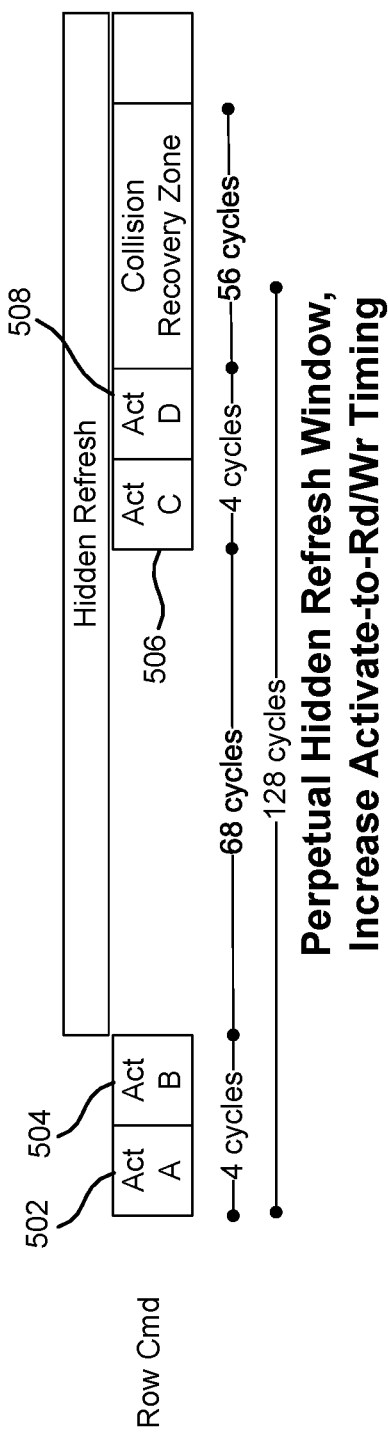

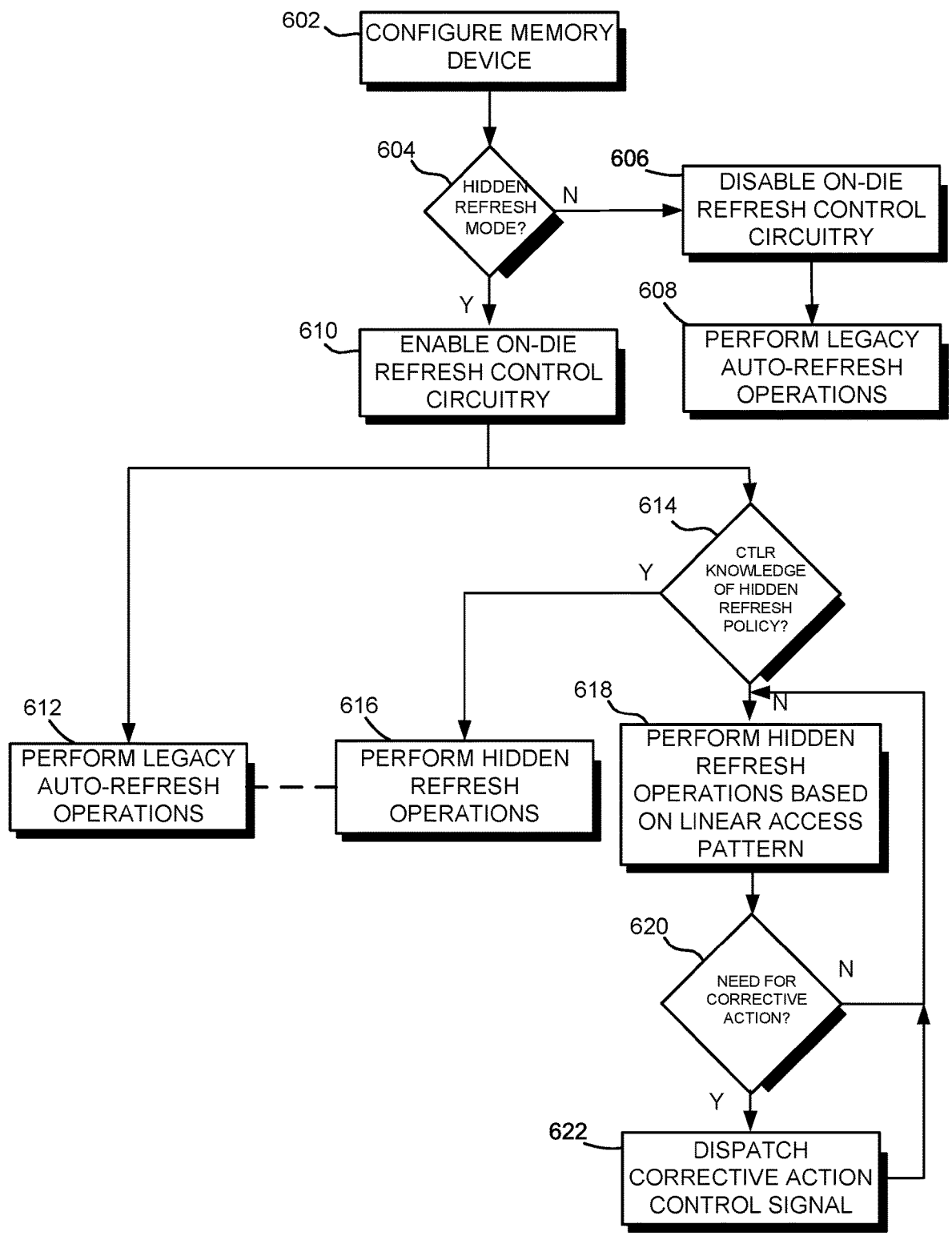

MEMORY DEVICE HAVING HIDDEN REFRESH

CROSS-REFERENCE TO RELATED APPLICATIONS

This application is a Non-Provisional that claims priority to U.S. Provisional Application No. 63/122,667 filed Dec. 8, 2020, entitled MEMORY DEVICE HAVING HIDDEN REFRESH, which is incorporated herein by reference in its entirety.

TECHNICAL FIELD

The disclosure herein relates to memory systems, and more specifically to memory devices, controllers and methods for performing active refresh operations on a per-bank basis.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 4 illustrates a timing diagram that shows one example of a timing window employed by the memory system of FIG. 1 to carry out memory access operations to two banks in an interleaved manner, with a hidden refresh interval available to refresh multiple idle banks.

FIG. 5 illustrates a timing diagram similar to FIG. 4, but using an alternative hidden refresh interval based on a modified memory access timing constraint.

FIG. 6 illustrates a flowchart for one embodiment of a refresh method of operation for the memory system of FIG. 1.

DETAILED DESCRIPTION

Embodiments of memory devices, controllers, associated methods and integrated circuits are disclosed herein. One embodiment of an integrated circuit (IC) memory device includes an array of storage cells configured into multiple banks. Interface circuitry receives refresh commands from a host memory controller to refresh the multiple banks for a first refresh mode. On-die refresh control circuitry selectively generates local refresh commands to refresh the multiple banks in cooperation with the host memory controller during a designated hidden refresh interval in a second refresh mode. Mode register circuitry stores a value indicating whether the on-die refresh control circuitry is enabled for use during the second refresh mode. The interface circuitry includes backchannel control circuitry to transmit a corrective action control signal during operation in the second refresh mode. By incorporating the on-die refresh control circuitry to selectively generate the local refresh commands in cooperation with the host memory controller, significant power savings and bandwidth enhancements associated with refresh operations may be realized.

Specific embodiments described herein provide apparatus and methods that provide hidden refresh operations on a per-bank basis. Refresh operations may thus be managed with a finer granularity to enhance refresh command efficiency and reduce overall power consumption within the memory device.

Figure 1:
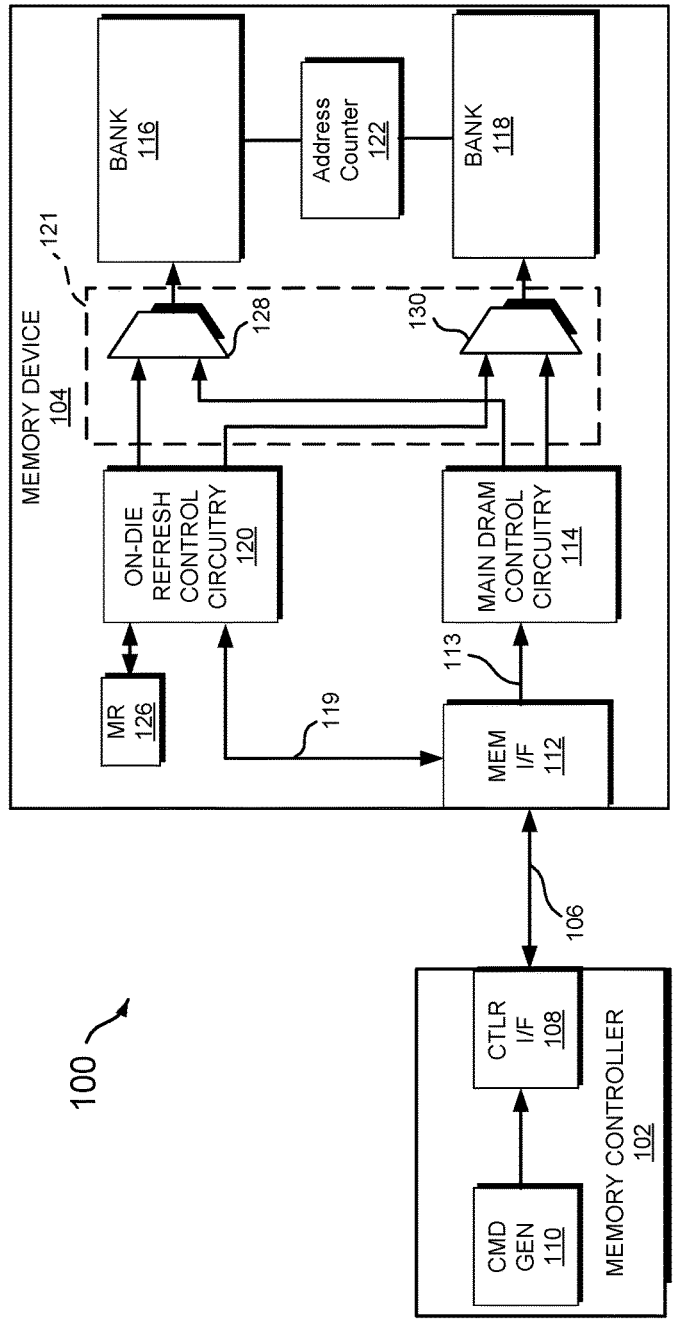
FIG. 1 illustrates one embodiment of a memory system that employs hidden refresh.

With reference to FIG. 1, a memory system, generally designated 100, is shown that includes a memory controller 102 coupled to a memory device 104 via bidirectional bus 106. For one embodiment, the memory controller is a dynamic random access memory (DRAM) controller, with the memory device realized as a DRAM memory device. In some embodiments, the memory controller and memory device may be embodied as integrated circuits, or chips. Other embodiments may employ the memory controller as a circuit in a general purpose processor. Specific embodiments for the DRAM memory controller and memory device may be compliant with various DRAM standards, including double data rate (DDR) variants, low power (LPDDR) versions, and graphics (GDDR) types. Other embodiments may include multi-chip modules that, for example, employ stacked memory die, or stacked packages. Such embodiments may be used with memory modules. Additional embodiments may stack memory die and logic die together in a common package, or in separate packages stacked upon each other.

Further referring to FIG. 1, the memory controller 102 includes a controller interface 108 for transferring data, command and control signals between the memory controller and the memory device 104 via the bus or channel 106. Command generation circuitry 110 generates various commands such as Activate (ACT), Precharge (PRE), Read (R), Write (W), and mode register write (MRW) commands for transmission to the memory device 104. For one embodiment, explained below, the command generation circuitry 110 generates refresh commands that are externally applied to the DRAM memory device during auto-refresh operations. Auto-refresh occurs while the memory system is in an active state to support an actively operating electronic device.

Further referring to FIG. 1, the memory device 104 includes a memory interface 112 that communicates with the memory controller 102. The memory interface 112 forwards the various command and control signals from the memory controller 102 along a main command/control bus 113 to main DRAM control circuitry 114. The main DRAM control circuitry manages distribution of the command and control signals, including the controller-generated refresh commands, throughout the memory device 104.

The memory device 104 generally includes an array of volatile storage cells such as dynamic random access memory (DRAM) storage cells. In one embodiment, the storage cells are organized into multiple banks 116 and 118. While showing only two banks in FIG. 1, for one embodiment, each memory device may include, for example, up to thirty-two banks or more. A refresh row address counter 122 is shared between banks 116 and 118. In other embodiments, there might be additional counters and circuits to refresh banks 116 and 118 at different times as an inner loop of the shared address counter 122. In yet another embodiment each bank might have its own per-bank refresh address counter. All refresh address counters can be controlled by the main DRAM control circuitry 114 and the on-die refresh control circuitry 120.

With continued reference to FIG. 1, the memory device 104 employs a bidirectional sideband command/control bus 119 that couples the memory interface 112 to on-die refresh control circuitry 120. For one embodiment, the on-die refresh control circuitry includes state machine logic that functions to supplement and mostly replace the auto-refresh operations managed by the host memory controller 102. The on-die refresh control circuitry also provides independent refresh control ability to each of the banks of the memory device.

While shown in FIG. 1 as a centralized block of circuitry, the on-die refresh control circuitry 120 may be centralized on the memory device 104 or distributed as smaller local circuits corresponding to the various banks. The sideband bus 119 enables the on-die refresh control logic 120 to monitor the host controller-generated command and control signals so that appropriate hidden refresh operations may be scheduled. For some embodiments, the on-die refresh control circuitry 120 generates corrective action signals for transmission to the memory controller 102 via backchannel control circuitry (not shown) disposed in the memory interface 112. Further details associated with hidden refresh operations and the corrective action signals are described below.

Further referring to FIG. 1, to support both the legacy auto refresh mode managed by the memory controller 102 and the hidden refresh mode managed by the on-die refresh control circuitry 120, the memory device 104 employs refresh command distribution circuitry 121. For one embodiment, the refresh command distribution circuitry 121 includes per-bank multi-input selectors, such as multiplexers 128 and 130 (or XOR gates) that receive input refresh command signals from both the on-die refresh control circuitry 120 and the main DRAM control circuitry 114. A selected one of the inputs for each multiplexer passes through as an output to the corresponding bank.

Generally, the on-die refresh control circuitry 120 is selectively enabled via configuration circuitry to provide per-bank hidden refresh commands to inactive banks in the memory device 104. For one embodiment, the configuration circuitry includes mode register circuitry 126 to store a mode value indicating whether the on-die refresh control circuitry 120 is enabled or disabled. The mode value may be stored upon initialization of the memory device 104 and/or set via an MRSet command dispatched by the host memory controller 102.

In operation, refresh operations directed to refreshing the multiple banks 116 and 118 of the memory device 104 may be performed in accordance with one of two modes. For a first mode of operation, referred to herein as a legacy auto-refresh mode, all refresh operations are directed and managed in bulk by the memory controller 102. Consistent with a variety of DRAM industry standards, the legacy auto-refresh mode of operation may attempt to refresh the entire memory device through, for example, a standardized number of, for example, eight-thousand refresh command sequences to refresh the entire memory device. Such a high number of command sequences often impacts the available bandwidth of the command/control bus 106 by upwards of four to nine percent.

While the legacy auto-refresh mode of operation often works well, there are usually more than eight-thousand rows in the multiple banks of the memory device. Some memory devices include up to thirty-two thousand rows, or more. Thus, significant concurrency takes place to perform the refreshes on a global scale while satisfying certain timing constraints that minimize power consumption, such as the standardized four activate window (tFAW) and eight-activate-window (tEAW) constraints. These timing constraints generally specify a timing interval within which only four or eight activate commands can be issued. Refreshing multiple rows concurrently due to these constraints takes longer than refreshing a single row, for example three hundred-fifty nanoseconds instead of forty-five nanoseconds.

For a second mode of operation, referred to herein as a hidden refresh mode, the host memory controller 102 operates similar to the legacy auto-refresh mode in scheduling refresh operations in bulk to the memory device, but has its refresh operations supplemented by the on-die refresh control circuitry 120. The supplementary hidden refresh operations are carried out on a per-bank basis, to inactive banks, and may not be subject to many of the timing constraints that regulate the refresh operations of the legacy mode. To carry out the hidden refresh operations, however, a certain level of coordination between the host memory controller 102 and the on-die refresh control circuitry takes place. The goal of the coordination is to have as many refresh commands as possible being issued by the on-die refresh control circuitry 120. Ideally, if the memory controller 102 takes the functionality and restrictions of the on-die refresh control circuitry 120 completely into account for its scheduling, all refresh commands can be issued by the on-die memory controller circuitry 120.

Figure 2:
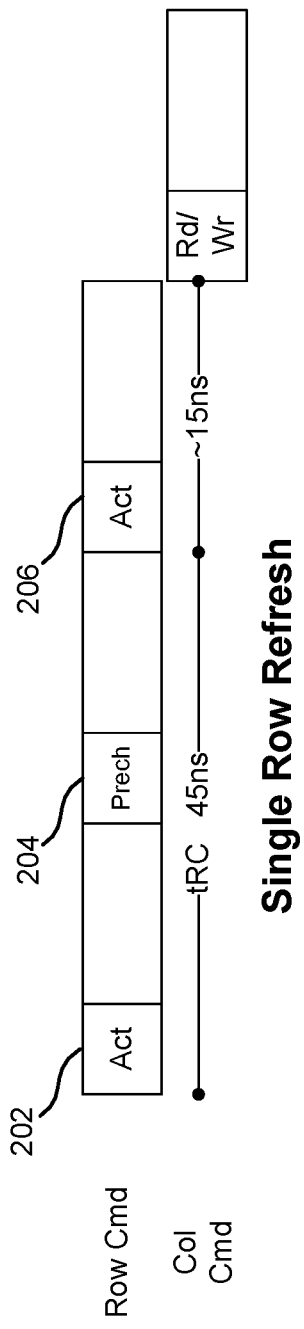
FIG. 2 illustrates a timing diagram that shows one example of the timing involved in carrying out a single row refresh operation with the memory system of FIG. 1.

For one embodiment, hidden refresh operations carried out during the hidden refresh mode are directed to single rows. FIG. 2 illustrates an exemplary timing interval associated with a single row refresh operation that may occur during the hidden refresh mode. Generally, a refresh operation involves an initial activate command, at 202, followed by a precharge command, at 204, resulting in one embodiment in a forty-five nanosecond timing window. To prepare the row for an incoming read/write operation (which doesn't occur during the refresh operation), an additional fifteen nanoseconds is provided in this embodiment via issuance of an additional activate command, at 206, resulting in a total refresh interval of sixty nanoseconds.

Figure 3:
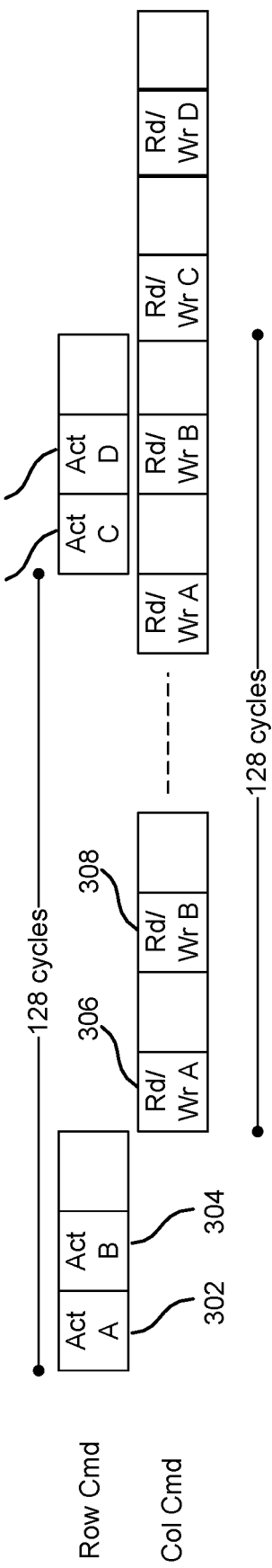
FIG. 3 illustrates a timing diagram that shows one example of the timing involved in carrying out two interleaved memory access operations involving two active banks of the memory system of FIG. 1.

The relatively short timing window associated with a single row refresh enables it to be employed as a background operation to unused banks while standard read/write operations are undertaken in active banks. FIG. 3 illustrates one embodiment of the timing involved in a sequence of commands dispatched by the memory controller to carry out read/write operations in four banks of the memory device, accessing a row in each bank and in an interleaved manner. A first pair of banks are activated by respective activate commands ActA and ActB, at 302 and 304, which take up four cycles. A series of read Rd or write Wr commands are then dispatched, at 306 and 308, in an alternating manner, with additional commands directed to the selected row of Banks A and B until the entire row is accessed. One-hundred-twenty-eight cycles (of a system clock) following dispatch of the initial activate commands ActA and ActB, a second set of banks C and D are activated by respective activate commands ActC and ActD, at 310 and 312.

Further referring to FIGS. 2 and 3, one can see that since a single row refresh takes approximately sixty nanoseconds (which corresponds to sixty cycles of a one-gigahertz system clock), and a one-hundred-twenty-four nanosecond gap exists in the command/control bus, additional refresh operations in the form of hidden refresh operations may be carried out in idle banks of the DRAM during the gap. This may be accomplished by the on-die refresh control circuitry 120 with little to no impact in the scheduling of command and control signals between the host memory controller 102 and the memory device 104.

The observation above provides one way of designating a hidden refresh window start and stop time based on a prediction of a regular access pattern of commands dispatched by the memory controller. FIG. 4 illustrates initial activate commands ActA and ActB, at 402 and 404 to activate banks A and B. A hidden refresh interval of one-hundred-twenty-four cycles is then shown, that includes a first sub-interval of eighty cycles, at 406, to carry out the actual hidden refreshes to any banks other than banks A and B, and a second sub-interval, at 408, involving an additional forty-four cycles as margin for avoiding potential collisions that may occur, for example, between commands from the memory controller to a bank receiving hidden refresh commands for a hidden refresh. For this particular embodiment, the host memory controller does not necessarily need to know if and when the on-die refresh controller is scheduling its hidden refreshes, or any other detailed hidden refresh policy rules followed by the memory device. As long as hidden refresh commands are not dispatched during the collision zone window, at 408, the risk of any collisions with commands generated by the host controller is very low.

For one embodiment, the host memory controller 102 follows the same hidden refresh policy recognized by the memory device 104, and predicts the hidden refresh activity carried out by the on-die refresh controller 120 in a manner such that a hidden refresh window may be designated through a change in the timing between commands issued by the host memory controller. For example, while a typical standardized linear timing between the start of an activation of a first pair of banks to activation of a second pair of banks is one-hundred twenty-eight cycles in the one-gigahertz system used as example, as discussed above and shown in FIG. 3, by scheduling the second pair of activation commands earlier, the timing between the second pair of activation commands and the follow-on read/write commands is increased, allowing the main DRAM control circuitry 114 the freedom to activate the second pair of banks at a time that is clear of the possibility of any collisions.

FIG. 5 illustrates one embodiment of the timing that may be employed for a situation where the activate-to-read/write command timing is extended. At 502 and 504, initial activate commands to banks A and B are issued by the host memory controller 102. Sixty-eight cycles following the end of the activate commands, a second set of activate commands ActC and ActD, at 506 and 508, are issued. As the main DRAM control circuitry 114 receives the second set of activate commands, sixty cycles prior to the standardized legacy timing, it can defer issuing the commands to the designated banks until the banks are clear of any potential collisions due to pending hidden refresh operations.

For other embodiments where the host memory controller 102 follows the hidden refresh policy recognized by the memory device 104, a new command protocol may be established that includes specific commands that designate a hidden refresh window. For example, the host memory controller 102 may dispatch a new activate command with a hidden refresh start command to inform the on-die refresh control logic that no more banks will be put into use and that hidden refreshes may commence. Such operations might be terminated via a hidden refresh stop command, or a first activate command to an unused bank, or after a certain number of cycles. Other embodiments may issue a new command to designate that all currently unused banks will remain unused for the hidden refresh window, with similar end commands as described above.

While various embodiments described above address different ways to designate a hidden refresh interval, for scenarios where the host memory controller doesn't actively follow the hidden refresh operations carried out by the memory device, a risk exists that a command sequence dispatched by the host memory controller may collide with hidden refresh commands directed to a previously idle bank, possibly resulting in a failed operation. To minimize this risk, for one embodiment, the on-die refresh control circuitry 120 monitors bank scheduling conditions for conflicts during the hidden refresh mode of operation, and conditionally transmits one or more corrective action control signals to the host memory controller 102 via the backchannel control circuitry disposed in the memory interface 112. Depending on the situation, the corrective action control signal may represent a variety of conditions such as a retry signal to re-perform a failed operation due to a collision, or an alert signal to inform the host memory controller to close one or more active banks in the memory device so that they can be refreshed.

For one embodiment, the ability to provide corrective action control signals is enhanced through adoption of a minimum set of rules for a hidden refresh policy. For example, one rule that significantly reduces the potential for collisions is to allow hidden refresh operations solely for banks with closed pages and no pending active commands. Another rule to add flexibility to the hidden refresh operations is to allow the on-die refresh control circuitry to adjust the order of addresses to undergo hidden refreshes based on need, or time of life, and bank usage. A further rule for some embodiments involves satisfying certain timing constraints such as the four activate window (tFAW) and eight activate window (tEAW) that defines a timing window within which only four (or eight) activate commands can be issued.

As explained above, in some embodiments, the host memory controller 102 is capable of monitoring or mirroring the scheduling of both its auto-refresh operations, and the hidden refresh operations handled by the on-die refresh controller 120. Thus, instead of relying on corrective action control signals from the on-die refresh controller 120 indicating collisions due to hidden refreshes and/or necessary refresh operations to active banks, the host memory controller 102 knows ahead of time when it can issue a refresh operation (or other operation) and will hold off doing so until the hidden refreshes are completed. For one embodiment, this may be accomplished by including a further detailed set of policy rules for DRAM hidden refreshes that pertain to refresh timings. For example, where the on-die refresh controller 120 detects that the host memory controller 102 hasn't carried out operations over the main control bus for a period of time, such as one-hundred cycles, then the on-die refresh controller 120 would be free to take advantage of the idle time through hidden refresh operations. Timers (not shown) on the host memory controller would be able to monitor the timing of the hidden refresh operations being carried out on the memory device 104 during the idle time period.

FIG. 6 illustrates a flowchart of one embodiment of a method of operation consistent with the embodiments described above. During an initialization process, such as when the memory system is first powered on, the memory device is configured, at 602, to operate with the host memory controller 102 in performing refresh operations through either the legacy auto-refresh mode or the hidden refresh mode that supplements the legacy auto-refresh mode with hidden refresh operations. This may be accomplished through loading of a particular mode value from non-volatile storage into the mode register circuitry 126, or through receipt of one or more MRSet commands from the host memory controller 102.

Once configured, the memory device 104 determines the refresh mode configuration, at 604, and if set to a legacy auto-refresh mode, then the on-die refresh control circuitry 120 is disabled, at 606, and the main DRAM control circuitry 114 performs bulk refresh operations, at 608, in response to refresh commands received from the host memory controller 102.

Further referring to FIG. 6, if the memory device 104 is configured to the hidden refresh mode, then the on-die refresh control circuitry is enabled, at 610, to supplement the host memory controller managing auto-refresh operations, at 612. Depending on whether the host memory controller has knowledge of the specific hidden refresh policy carried out by the memory device, the host memory controller may or may not coordinate with the memory device in a way that eliminates potential command collisions. Thus, where it's determined, at 614, that a high degree of cooperation between the host memory controller and the memory device occurs for hidden refresh operations (reflected by the phantom line), then the on-die refresh control circuitry 120 performs hidden refresh operations, at 616, in response to special commands dispatched by the host memory controller, or performed concurrent (to idle banks) with read/write command sequences employing the modified activate-to-read/write timing discussed above.

With continued reference to FIG. 6, where it's determined, at 614, that the host memory controller does not follow the hidden refresh operations of the on-die refresh control circuitry 120, then the on-die refresh control circuitry performs hidden refresh operations to idle banks of the memory device, at 618, concurrent with pre-determined, e.g. linear, access patterns applied to non-idle banks. With the on-die refresh control circuitry monitoring both its own hidden refresh operations and those distributed by the main DRAM control circuitry 114, should the on-die refresh control circuitry detect a collision or other condition necessitating corrective action, at 620, then a corrective action control signal may be dispatched back to the host memory controller 102, at 622, to inform the host memory controller that appropriate action may be required.

Thus, during operation in the hidden refresh mode, bulk memory refresh operations may be carried out mostly by targeted and finely granular single row refreshes that may be carried out in any order, and independently of other idle banks, but still consistent with legacy standardized refresh rates and constraints. The supplemental hidden refresh operations thus allows the memory device storage cells to be refreshed at refresh rates exceeding those of legacy auto-refresh rates, with a level of control and power efficiency exceeding legacy auto-refresh schemes.

While the embodiments described above are generally disclosed in the context of a single memory device, the principles disclosed herein work well in memory module and other high-capacity memory storage environments, such as high bandwidth memory (HBM) configurations.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit (IC) memory device comprising:
an array of storage cells configured into multiple banks;
interface circuitry to receive refresh commands from a host memory controller to refresh the multiple banks for a first refresh mode;
on-die refresh control circuitry to selectively generate local refresh commands to refresh the multiple banks in cooperation with the host memory controller during a designated hidden refresh interval in a second refresh mode;
mode register circuitry to store a value indicating whether the on-die refresh control circuitry is enabled for use during the second refresh mode; and
wherein the on-die refresh control circuitry is configured to generate a corrective action control signal in the second refresh mode to indicate a retry request for the host memory controller due to a failed operation caused by a collision between a memory request command to a given bank of the multiple banks and a hidden refresh operation to the given bank.

2. The IC memory device of claim 1, wherein the on-die refresh control circuitry is configured to generate the corrective action control signal to indicate a request to refresh a currently active bank of the multiple banks.

3. The IC memory device of claim 1, wherein the designated hidden refresh interval is based on a monitored activation pattern from the host memory controller.

4. The IC memory device of claim 1, wherein the designated timing interval is based on a command issued by the host memory controller to specify when the on-die refresh control circuitry is to start a hidden refresh operation.

5. The IC memory device of claim 4, wherein the designated timing interval ends in response to receiving a stop command from the host memory controller.

6. The IC memory device of claim 4, wherein the designated timing interval ends in response to receiving a first Activate command from the host memory controller to an unused bank of the multiple banks.

7. The IC memory device of claim 4, wherein the designated timing interval ends in response to expiration of a predetermined number of system clock cycles.

8. The IC memory device of claim 1, wherein each hidden refresh operation comprises a single row refresh operation for a selected one of the multiple banks.

9. An integrated circuit (IC) memory device comprising:
an array of storage cells configured into multiple banks;
interface circuitry to receive refresh commands from a host memory controller to refresh the multiple banks for a first refresh mode;
on-die refresh control circuitry to selectively generate local refresh commands to refresh the multiple banks in cooperation with the host memory controller during a designated hidden refresh interval in a second refresh mode;
mode register circuitry to store a value indicating whether the on-die refresh control circuitry is enabled for use during the second refresh mode;
wherein the on-die refresh control circuitry is configured to conditionally transmit a corrective action control signal during operation in the second refresh mode;
for the first refresh mode, a first timing interval between an Activate command and a corresponding memory access command is of a first duration;
for the second refresh mode, a second timing interval between the Activate command and the corresponding memory access command is of a second duration longer than the first duration; and
wherein the designated hidden refresh interval is based on the second timing interval.

10. A method of operation in a memory device, the method comprising:
storing data in an array of storage cells organized into multiple banks;
configuring the memory device to generate hidden refresh commands on-die during a hidden refresh mode of operation;
receiving commands from a host memory controller to start a memory access operation with at least one selected bank from the multiple banks, the memory access operation occurring during a memory access interval;
performing a hidden refresh operation to at least one idle bank of the multiple banks during a designated hidden refresh interval that at least partially overlaps the memory access interval; and
generating a corrective action control signal indicating a request for the host memory controller due to a failed operation caused by a collision between a memory request command to a given bank of the multiple banks and a hidden refresh operation to the given bank.

11. The method of claim 10, wherein the notifying comprises:
generating a corrective action control signal indicating a request to refresh a currently active bank of the multiple banks.

12. The method of claim 10, wherein the designated hidden refresh interval is based on a monitored activation pattern from the host memory controller.

13. The method of claim 10, wherein the designated timing interval is based on a command issued by the host memory controller to specify when the on-die refresh control circuitry is to start a hidden refresh operation.

14. A method of operation in a memory device, the method comprising:
storing data in an array of storage cells organized into multiple banks;
configuring the memory device to generate hidden refresh commands on-die during a hidden refresh mode of operation;
receiving commands from a host memory controller to start a memory access operation with at least one selected bank from the multiple banks, the memory access operation occurring during a memory access interval;
performing a hidden refresh operation to at least one idle bank of the multiple banks during a designated hidden refresh interval that at least partially overlaps the memory access interval;
notifying the host memory controller of any corrective action following the performing of the hidden refresh operation;
for a non-hidden refresh mode, a first timing interval between an Activate command and a corresponding memory access command is of a first duration;

for the hidden refresh mode, a second timing interval between the Activate command and the corresponding memory access command is of a second duration longer than the first duration; and wherein the designated hidden refresh interval is based on the second timing interval.

15. An integrated circuit (IC) dynamic random access memory (DRAM) device, comprising:

mode register circuitry to store a refresh mode control value;

on-die refresh control circuitry selectively enabled based on the mode control value;

a first bank of storage cells responsive to a first memory access request from a host memory controller to perform a first memory access operation during a memory access interval;

a second bank of storage cells responsive to hidden refresh commands generated on-die by the refresh control circuitry to undergo a hidden refresh operation during a designated hidden refresh interval that at least partially overlaps the memory access interval; and wherein the refresh control circuitry conditionally dispatches a corrective action control signal to the host memory controller indicating a retry request for the host memory controller due to a failed operation caused by a collision between a memory request command to a given bank of the multiple banks and a hidden refresh operation to the given bank.

16. The IC DRAM device of claim 15, wherein the refresh control circuitry is configured to generate the hidden refresh commands on a per-bank basis along a dedicated hidden refresh bus coupling the refresh control circuitry to each of the first bank of storage cells and the second bank of storage cells.

17. The IC DRAM device of claim 15, wherein the refresh control circuitry is configured to generate the hidden refresh commands to banks that do not have commands sent to them from the host memory controller.

18. The IC DRAM device of claim 17, wherein each of the hidden refresh commands comprises a single row refresh command to refresh a single row of the second bank of storage cells.

* * * * *